(12) United States Patent
Conway

(10) Patent No.: US 7,240,231 B2
(45) Date of Patent: Jul. 3, 2007

(54) SYSTEM AND METHOD FOR SYNCHRONIZING MULTIPLE INSTRUMENTATION DEVICES

(75) Inventor: Craig M. Conway, Leander, TX (US)

(73) Assignee: National Instruments Corporation, Austin, TX (US)

(*) Notice: Subject to any disclaimer, the term of this patent is extended or adjusted under 35 U.S.C. 154(b) by 773 days.

(21) Appl. No.: 10/260,597

(22) Filed: Sep. 30, 2002

(65) Prior Publication Data

US 2004/0064750 A1    Apr. 1, 2004

(51) Int. Cl.
*G06F 1/00* (2006.01)
(52) U.S. Cl. .................................................. 713/401
(58) Field of Classification Search ............... 713/401
See application file for complete search history.

(56) References Cited

U.S. PATENT DOCUMENTS

| | | | | |
|---|---|---|---|---|
| 4,980,577 A | * | 12/1990 | Baxter | 327/198 |
| 5,450,458 A | * | 9/1995 | Price et al. | 375/356 |
| 5,717,704 A | * | 2/1998 | Rosenfeld | 714/736 |
| 5,969,631 A | * | 10/1999 | Ammler et al. | 340/825.21 |
| 6,127,976 A | * | 10/2000 | Boyd et al. | 342/463 |
| 6,163,583 A | * | 12/2000 | Lin et al. | 375/354 |
| 6,297,760 B1 | | 10/2001 | Hungerbuehler et al. | |
| 2001/0011313 A1 | | 8/2001 | Hungerbuehler et al. | |

OTHER PUBLICATIONS

PXI systems Alliance Press Release Aug. 22, 2001, 9 pages.
http://www.acqiris.com/home/EntreProduct12.html "Bus Synchronizes Clock and Triggers in Modules to 100 ps!" printed Feb. 12, 2002, 2 pages.

* cited by examiner

*Primary Examiner*—Rehana Perveen
*Assistant Examiner*—Eric Chang
(74) *Attorney, Agent, or Firm*—Meyertons Hood Kivlin Kowert & Goetzel, P.C.; Jeffrey C. Hood

(57) ABSTRACT

Trigger reception on different instrumentation devices may be synchronized by each instrumentation device generating one or more trigger enable signals and delaying performance of an operation in response to a trigger signal until a transition in a trigger enable signal. An instrumentation system may include several instrumentation devices and a communication medium coupling the instrumentation devices. One of the instrumentation devices may process data in response to a sample clock signal. That instrumentation device may also generate a trigger enable signal and delay performing an operation in response to a trigger signal transmitted via the communication medium until a transition in the trigger enable signal occurs. The trigger enable signal is not the sample clock signal. The trigger enable signal may be synchronized to another trigger enable signal generated by another one of the instrumentation devices.

5 Claims, 13 Drawing Sheets

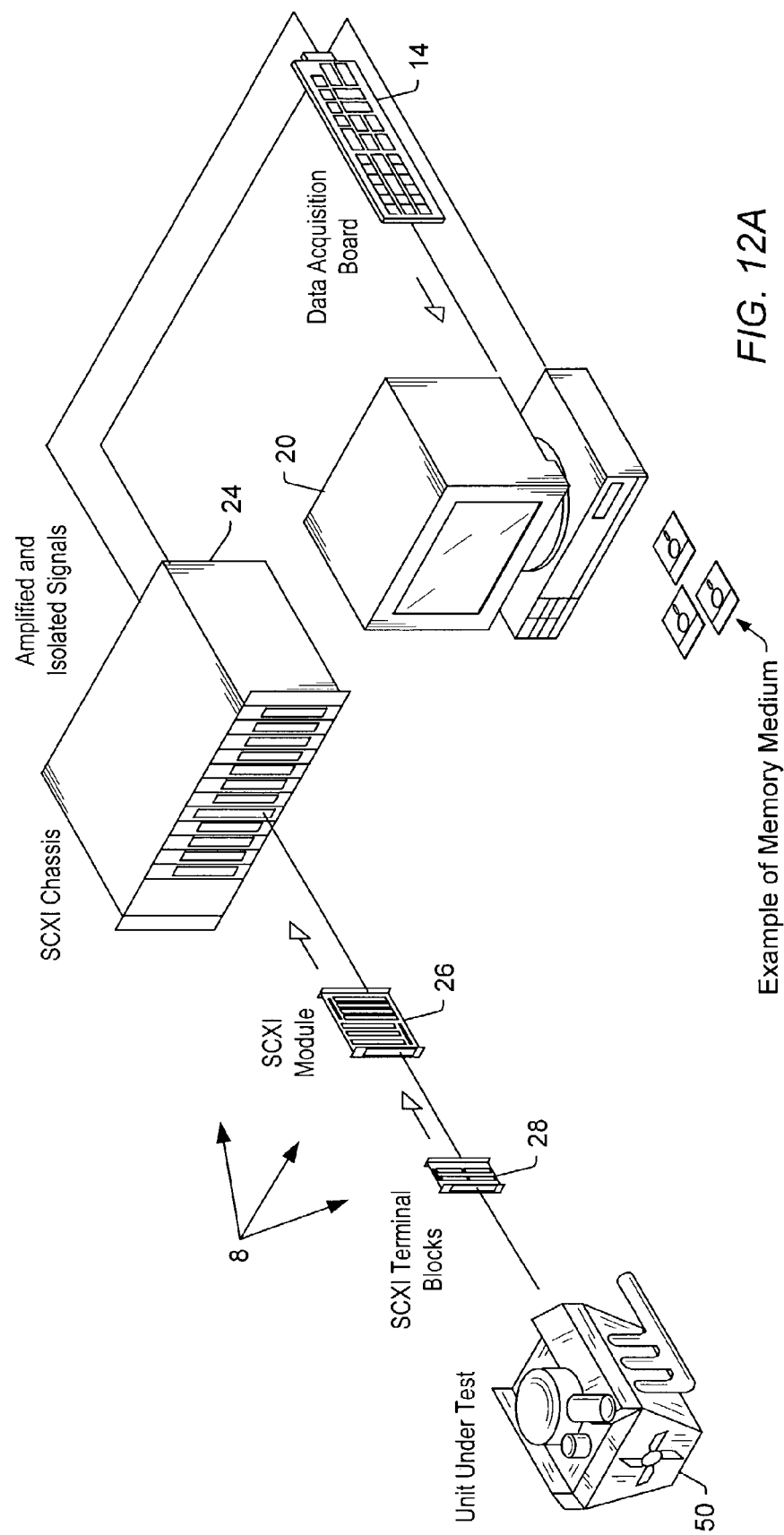

SYSTEM AND METHOD FOR SYNCHRONIZING MULTIPLE INSTRUMENTATION DEVICES

BACKGROUND OF THE INVENTION

1. Field of the Invention

This invention relates to instrumentation systems and, more particularly, to synchronizing instrumentation devices.

2. Description of the Related Art

Some instruments are devices that collect data or information from an environment or unit under test (UUT) and display this information to a user. An instrument may also analyze and process acquired data prior to displaying the data to the user. Some instruments provide test stimuli to a UUT. Examples of instruments include oscilloscopes, digital multimeters, pressure sensors, arbitrary waveform generators, digital waveform generators, etc. The information that may be collected by respective instruments includes information describing voltage, resistance, distance, velocity, pressure, frequency of oscillation, humidity, or temperature, among others.

Computer-based instrumentation systems typically include transducers for transducing a physical phenomenon into an electrical signal, signal conditioning logic to perform amplification, isolation, and/or filtering, and analog-to-digital (A/D) conversion logic for receiving analog signals and providing corresponding digital signals to the host computer system.

In a computer-based system, the instrumentation hardware or device is typically an expansion board plugged into one of the I/O slots of the computer system. In another common instrumentation system configuration, the instrumentation hardware is coupled to the computer system via other means such as through a VXI (VME eXtensions for Instrumentation) bus, a GPIB (General Purpose Interface Bus), a PXI (PCI eXtensions for Instrumentation) bus, a serial port or bus, or parallel port of the computer system. The instrumentation hardware may include a DAQ board, a computer-based instrument such as a multimeter, or another type of instrumentation device.

The instrumentation hardware may be configured and controlled by software executing on the computer system. The software for configuring and controlling the instrumentation system typically includes driver software and the instrumentation application software, or the application. The driver software serves to interface the instrumentation hardware to the application and is typically supplied by the manufacturer of the instrumentation hardware or by a third party software vendor. The application is typically developed by the user of the instrumentation system and is tailored to the particular function that the user intends the instrumentation system to perform. The instrumentation hardware manufacturer or third party software vendor sometimes supplies application software for applications that are common, generic, or straightforward.

Instrumentation driver software provides a high-level interface to the operations of the instrumentation device. The instrumentation driver software may operate to configure the instrumentation device for communication with the host system and to initialize hardware and software to a known state. The instrumentation driver software may also maintain a soft copy of the state of the instrument and initiated operations. Further, the instrumentation driver software communicates over the bus to move the device from state to state and to respond to device requests.

Some computerized instrumentation systems include several instrumentation and/or DAQ devices. Each device may generate and/or capture data based on a sample clock. For example, the sample clock on an arbitrary waveform generator may drive a DAC. Two or more devices may be considered to be digitally synchronized when their data capture and/or data generation circuits line up within a sample clock cycle. Digital synchronization may occur when the sample clocks of each device to be synchronized have substantially the same frequency (e.g., the devices' sample clocks may experience instantaneous frequency differences but, on average, the devices' sample clocks may not drift relative to each other). In addition, for digital synchronization, the devices to be synchronized are preferably able to respond to a trigger within the same sample clock period, and in the case of output devices, to output their data to a connector at substantially the same time. As described herein, two clocks are in phase when they are measured as having substantially the same frequency and substantially zero degrees of phase difference.

If the sample clock frequency for a set of devices is chosen to be an integer multiple of a reference clock signal received by all of the devices in that set, and if the frequency multiplier used within each device has substantially zero degrees of phase delay, then the devices in that set will have sample clocks that are synchronous to each other, subject to the tolerance of the reference signal, their layout, and the sample clock generation circuits used by each device. As such, a rising edge on the reference signal will correspond to a rising edge on each device's sample clock.

Even though choosing the sample clock frequency to be an integer multiple of a common reference signal may result in sample clocks that are in phase from device to device (subject to various component and routing tolerances), it may not necessarily achieve a desired type of synchronization (e.g., digital synchronization). For example, in order to achieve digital synchronization between a set of instrumentation devices, trigger conditions should preferably affect every device in the set on the same sample clock edge. If the frequency of the sample clock is too high to reliably pass a bussed signal from one device to another, the trigger signals may either be sent in a slower clock domain than that of the sample clock, such as the reference clock domain, or on a non-bussed means of sending the trigger signal (such as a point-to-point connection) may be used to send trigger signals.

In systems where the set of devices have sample clock frequencies that are not integer multiples of the sample clock frequency, achieving digital synchronization may be even more difficult. The reference clock signal seen by the devices in the set may have a low enough frequency that trigger signals clocked by the reference clock signal can be reliably passed from device to device. However, rising edges on the reference clock may not correspond to rising edges on the sample clock since the frequency of the sample clock is not an integer multiple of the reference clock. If the rising edges of the two clocks do not correspond (or if the phase relationship of sample clocks to the reference clock cannot be guaranteed), clocking trigger signals with the reference clock signal may ensure that devices of the same sample clock frequency will see a trigger at roughly the same time. However, clocking trigger signals with the reference clock signal may not ensure that two devices will see the trigger assertion in the same sample clock cycle.

To illustrate this point, assume two devices each include the simple circuit shown in FIG. 1 for trigger transfer from the reference clock domain to the sample clock domain. In FIG. 1, a first D flip-flop 10 receives a trigger input (e.g., from a bus connecting several instrumentation devices). D flip-flop 10 is clocked by the common reference signal (e.g., a 10 MHz signal). The output of D flip-flop 10, cTrig, is input to a second D flip-flop 12, which is clocked by each device's sample clock. The output of D flip-flop 12 is signal mTrig.

Even if the sample clocks of the two devices are in phase, FIG. 2 shows a timing diagram that illustrates why the trigger may not be seen in the same sample clock cycle on both devices. The output cTrig of the first flip-flop 10 may change too close to the rising edge of the sample clock, causing a setup violation because the input to the second flip-flop has not been stable for the necessary setup time. This setup violation causes the output mTrig of the second flip-flop 12 to be metastable. When the metastability finally settles, it may do so differently on each device, causing them to see the same transition in the trigger signal in different sample clock cycles. Thus, synchronization may be difficult when the sample clock frequency is not an integer multiple of the reference clock frequency.

As these examples show, it is desirable to be able to synchronize multiple devices in an instrumentation system, even if the devices use sample clocks whose frequencies are not integer multiples of a common reference frequency. For example, it is desirable to be able to have digitally synchronized instrumentation devices.

SUMMARY

Various embodiments of a method and system for synchronizing trigger reception and generation on different instrumentation devices may involve each instrumentation device generating one or more trigger enable signals and delaying receipt (or driving) of a trigger signal until a transition (e.g., a rising or falling edge) in a trigger enable signal. In one embodiment, an instrumentation system may include several instrumentation devices and a communication medium (e.g., a bus) coupling the instrumentation devices. One of the instrumentation devices may process data in response to a sample clock signal. The sample clock signal may be generated by that instrumentation board from a reference clock signal. That instrumentation device may generate a trigger enable signal and delay performance of an operation in response to a trigger signal transmitted via the communication medium until a transition in the trigger enable signal. The trigger enable signal is not the sample clock signal. The trigger enable signal may be synchronized to another trigger enable signal generated by another one of the instrumentation devices.

The instrumentation device may include a trigger enable signal generator coupled to receive the sample clock signal. The trigger enable signal generator may generate a trigger clock signal that is in phase with the sample clock and has a frequency equal to 1/N of a frequency of the sample clock, where N>1. The trigger clock signal may be used as the trigger enable signal in one embodiment. In other embodiments, the trigger clock signal may be used to generate one or more trigger enable signals. For example, the trigger enable signal generator may assert the trigger enable signal for one period of the sample clock signal each time a rising edge of the trigger clock signal occurs. Another trigger enable signal (e.g., used to control when that instrumentation device drives triggers onto the communication medium) may be asserted for one sample clock period each time a falling edge of the trigger clock signal occurs.

In one embodiment, a method may involve a first instrumentation device processing data in response to a sample clock signal, the first instrumentation device generating a trigger enable signal, a second instrumentation device communicating a trigger signal to the first instrumentation board, and the first instrumentation device delaying performance of an operation in response to the trigger signal until a transition in the trigger enable signal.

BRIEF DESCRIPTION OF THE DRAWINGS

A better understanding of the present invention can be obtained when the following detailed description is considered in conjunction with the following drawings, in which:

FIGS. 11A-12B show various embodiments of instrumentation systems.

Figure 1:
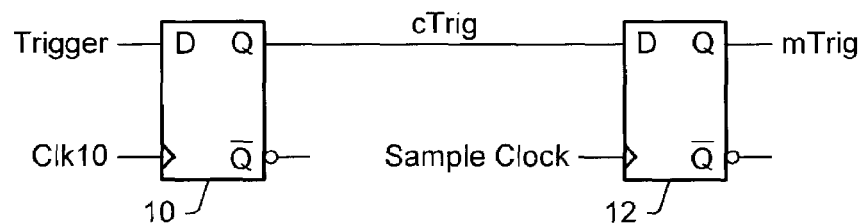
FIG. 1 illustrates an exemplary prior art circuit used to transfer a trigger signal from a reference clock domain to a sample clock domain.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Figure 3:
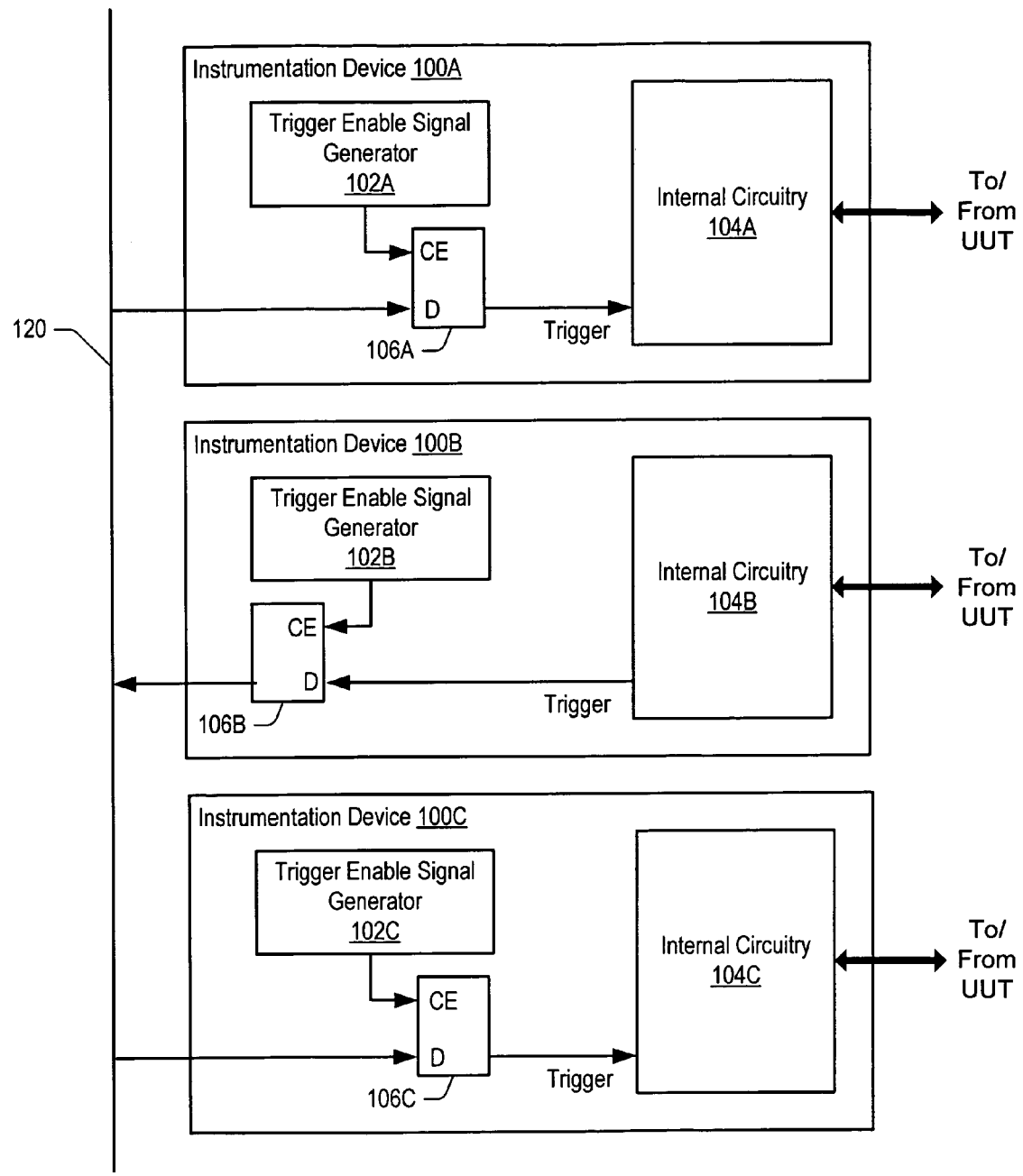
FIG. 3 shows a block diagram of one embodiment of an instrumentation system.

FIG. 3 shows a block diagram of one embodiment of an instrumentation system. Here, three instrumentation devices 100A, 100B, and 100C (collectively, instrumentation devices 100) are coupled by a communication medium 120. Each instrumentation device 100 may be configured to send and/or receive trigger signals on the communication medium 120. As shown, instrumentation device 100B may be configured to generate a trigger signal and to drive the trigger signal onto communication medium 120. Instrumentation devices 100A and 100C may be configured to receive the trigger signal from the communication medium 120. Each instrumentation device 100 includes respective internal circuitry 104A, 104B, 104C (collectively, internal circuitry 104) that may generate and/or receive trigger signals transmitted on communication medium 120. Each instrumentation device 100 may also be configured to provide stimuli to and/or receive stimuli from a unit under test (as shown), process under test, and/or device being controlled and monitored.

As used herein, the term "communication medium" is intended to have its ordinary meaning as any of various types of media used to communicate data and/or control signals between devices. The term communication medium is intended to include media used for wireless communications (e.g., the atmosphere) as well as media used for wired communications (e.g., buses, point-to-point interconnects). Exemplary communication media may include buses such as IEEE 1394 buses, PCI (Peripheral Component Interconnect), PXI (PCI extensions for Instrumentation), SIX (Signal Conditioning extensions for Instrumentation), CompactPCI, USB (Universal Serial Bus), PCI Express, etc. Other exemplary types of communication media include networks such as Ethernet, LANs (Local Area Networks), and WANs (Wide Area Networks). Note that the communication medium shown in FIG. 3 may represent various types of physical connections including metallic wire/cable(s), optical fiber(s), the atmosphere, etc., or any combination thereof.

As used herein, the term "device" is intended to have its ordinary meaning and to include any of various types of devices, units or components that generate and/or consume data in response to a clock signal. An "instrumentation device" is a device that performs an instrumentation and/or measurement function. The term "device" is intended to include "programmable devices" and "non-programmable devices." An instrumentation device may, in some embodiments, be implemented as an instrumentation board configured to be inserted into a computer system or instrumentation system. In other embodiments, an instrumentation device may be implemented in its own housing or chassis and configured to be coupled to a computer system or instrumentation system. Some instrumentation devices may be configured for use in instrumentation, control and monitoring, and/or industrial automation systems. Several exemplary instrumentation devices and communication media are shown in FIGS. 17-18 below.

Figure 2:
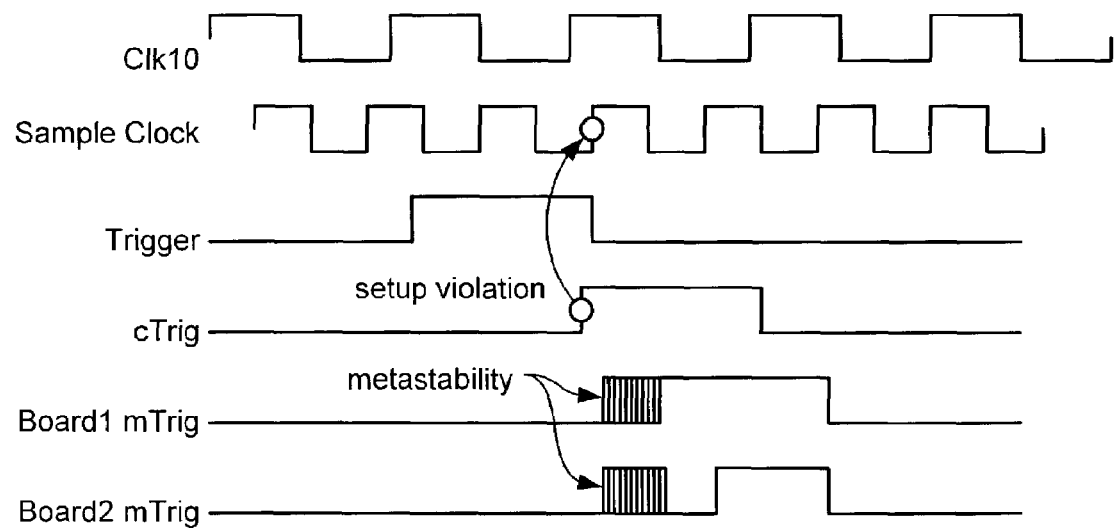
FIG. 2 is a timing diagram illustrating how two devices with sample clocks that are in phase may see the same trigger signal in different sample clock cycles.

As used herein, the term "programmable device" is intended to include any of various types of devices that include one or more of: 1) a processor and memory; or 2) a programmable hardware element or reconfigurable logic. Exemplary types of processors include a conventional microprocessor or CPU (such as an X86, PowerPC, SunSparc, etc.), a digital signal processor (DSP), microcontroller, or other type of processor. Exemplary types of programmable hardware elements include a programmable logic device (PLD), e.g., an FPGA (field programmable gate array), or other types of reconfigurable logic. Exemplary types of programmable devices include computer systems; network devices; personal digital assistants (PDAs); television systems; measurement devices (including instruments, industrial automation devices, process control devices, smart data acquisition devices, smart sensors (including smart cameras), smart actuators, video devices (e.g., digital cameras, digital video cameras); audio devices; computer peripherals; telephones; appliances; or other processor-based or programmable hardware-based devices. Exemplary measurement and automation devices include any of the devices shown in FIGS. 2A and 2B. Exemplary network devices include network interface cards, routers, bridges, switches, hubs, etc.

The term "non-programmable device" is intended to include any of various components, such as transducers, sensors, connector blocks, cabling, and other non-programmable devices.

As used herein, a trigger is received by an instrumentation device 100 when it is provided from an external communication medium 120 to internal circuitry 104 whose operation may be controlled by the trigger (as opposed to circuitry that merely transfers the trigger signal from one clock domain to another, such as D flip-flop 106B). Thus, in FIG. 3, instrumentation device 100B receives a trigger when the trigger is output from D flip-flop 106B to internal circuitry 104B. The internal circuitry 104B may perform one or more operations in response to receiving a trigger. An instrumentation device 100 drives a trigger when that trigger is output onto a communication medium 120 that connects two or more instrumentation devices 100.

Each device 100 that is to be synchronized may be configured to generate one or more trigger enable signals that enable the driving and/or receiving of triggers by that device. Thus, each device 100 may be configured to delay performance of an operation (e.g., by internal circuitry 104) in response to a trigger signal conveyed over the communication medium 120 until a transition in that device's trigger enable signal. For example, each device may buffer or otherwise delay a trigger signal (e.g., by inputting the trigger signal to a D flip-flop) until a transition in the trigger enable signal. For example, a trigger signal may be delayed by using the trigger enable signal as the clock for a D flip-flop in one embodiment. In the illustrated embodiment, trigger signals are delayed by using a trigger enable signal as a clock enable (CE) signal for a D flip-flop. Once the trigger is output to the internal circuitry 104, the internal circuitry may perform one or more responsive operations. Thus, delaying the time at which the internal circuitry 104 receives the trigger signal may delay the time at which one or more responsive operations are performed. Similarly, each device that drives triggers may delay driving a trigger onto the communication medium 120 until a transition in that device's trigger enable signal.

In the embodiment of FIG. 3, instrumentation device 100A includes a trigger enable signal generator 102A, a D flip-flop 106A, and internal circuitry 104A. The D flip-flop 106A's input is coupled to receive a trigger signal transmitted over the communication medium 120. In response a transition in an enable signal generated by the enable signal generator 102A, flip-flop 106A outputs the trigger signal to internal circuitry 104A, allowing the internal circuitry to receive the trigger signal. Similarly, instrumentation device 100B includes a trigger enable signal generator 102B. The trigger enable signal enables (or, in alternative embodiments, clocks) a D flip-flop 106B, allowing a trigger generated by internal circuitry 104B to be driven onto communication medium 120. The trigger enable signal (or signals) generated by each device control the generation and/or receipt of external triggers by each device. The trigger enable signals may be used to synchronize devices in an instrumentation system. For example, in some embodiments, trigger enable signals may allow multiple devices to be digitally synchronized. In other embodiments, trigger enable signals may allow multiple devices to operate in lockstep.

Figure 4:
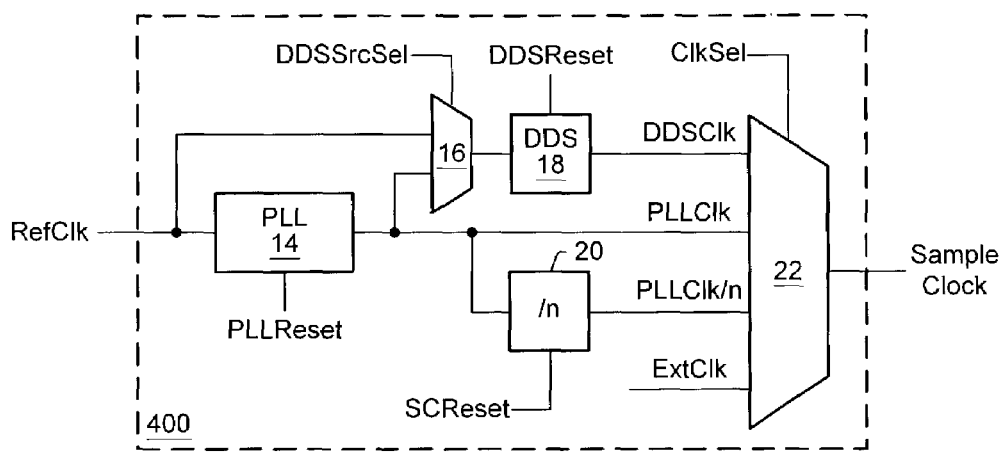
FIG. 4 is a block diagram of a sample clock generation circuit that may be included in some embodiments of an instrumentation device.

Each instrumentation device 100 that is to be synchronized may include a clock generation circuit 400 like the one shown in FIG. 4. Clock generation circuit 400 is configured to generate a sample clock. In many embodiments, each device's clock generation circuit 400 may generate a sample clock that has the same frequency as each other device's sample clock signal. The clock generation circuits may be configured so that each device's sample clock is in phase with the sample clocks of the other devices 100 in some embodiments.

FIG. 4 shows one embodiment of a clock generation circuit 400. In this embodiment, clock generation circuit 400 includes a PLL (Phase Locked Loop) 14 generates a PLLClk signal from a reference clock signal RefClk. In alternative embodiments, a DLL (Delay Locked Loop) may be used instead of or in additional to PLL 14. The reference signal may be a 10 MHz reference clock. In PXI embodiments, the reference signal may come from the PXI backplane. In some PCI embodiments, the reference signal may be the RTSI_OSC signal. If a PLL is used the output PLLClk of the PLL may have any frequency for which the PLL can lock on to the reference clock signal RefClk.

In some embodiments, the sample clock signal may not be an integer multiple of the reference clock signal. In one such embodiment, the PLL or DLL used to generate the sample clock may be configured such that it will respond consistently to a reset signal PLLReset that is received synchronously to the reference clock signal. In other such embodiments, each instrumentation device may include calibration circuitry to measure and adjust the phase of that device's sample clock signal.

A DDS (Direct Digital Synthesis) unit 18 receives an input selected by a DDSSrcSel input to a multiplexer 16. In this embodiment, the multiplexer 16 selects between the RefClk signal and the output of the PLL 14. The DDS 18 operates on the input signal provided by multiplexer 16 to generate a DDSClk signal.

A frequency divider circuit 20 may divide the PLLClk signal by n to generate a PLLClk/n signal.

A ClkSel input to a multiplexer 22 may select which signal to output from the sample clock generation circuit 400 as the sample clock signal. For example, depending on the current value of ClkSel, the sample clock may equal an external clock signal ExtClk, the output PLLClk of the PLL 14, the output PLLClk/n of the frequency divider 20, or the output DDSClk of the DDS 18. Other embodiments of a sample clock generation circuit 400 may select between fewer or additional numbers of signals (e.g., using multiplexer 22) when selecting which signal to output. The sample clock signals used in a set of instrumentation devices may determine the degree of synchronization that can be achieved for that set of devices in some embodiments.

Figure 5:
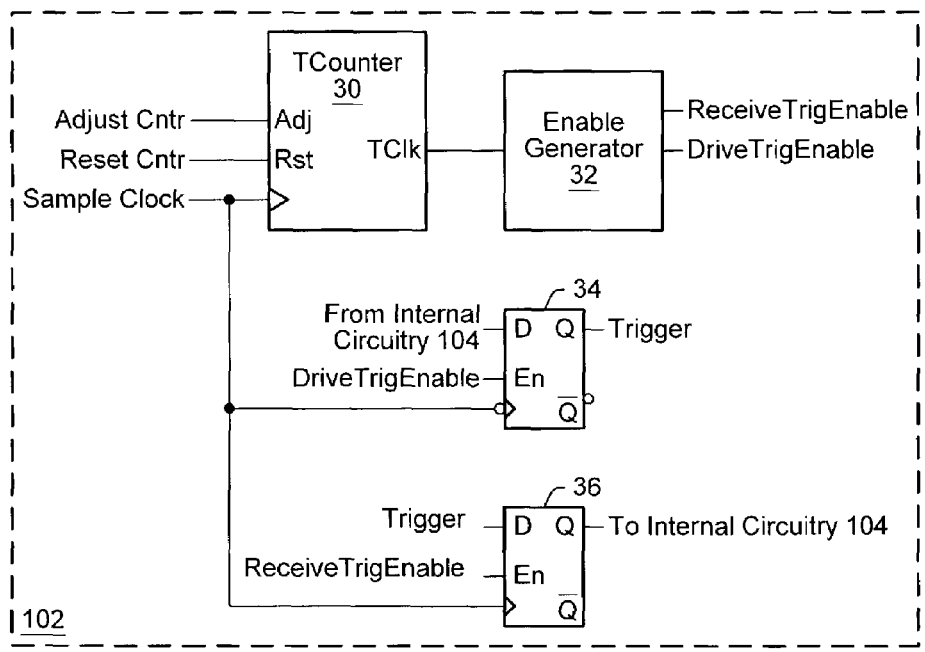
FIG. 5 is a block diagram of one embodiment of a trigger enable signal generator circuit.

FIG. 5 shows one embodiment of a trigger enable signal generator 102 that may be used to control the receipt and/or generation of trigger signals by an instrumentation device 100. In one embodiment, a trigger enable signal generator 102 may be implemented in an FPGA (Field Programmable Gate Array). Each instrumentation device 100 that is to be synchronized may include a trigger enable signal generator 102 similar to the one shown in FIG. 5. In this embodiment, the trigger enable signal generator 102 includes a counter 30, an enable generator 32, and two D flip-flops 34 and 36. As shown, the inputs to the trigger enable signal generator 102 may include a sample clock signal generated by a clock generation circuit 400 like the one shown in FIG. 4.

In the embodiment of FIG. 5, two trigger enable signals are derived from an intermediate signal (referred to as TClk in this disclosure). Each device may generate TClk by dividing the sample clock signal. For example, in a PXI system, each device may divide its sample clock signal down to a frequency that is low enough to allow triggers to be reliably sent and received over the PXI backplane. Similarly, in a PCI system, devices may divide their sample clocks down to a frequency at which triggers may reliably be sent over the RTSI bus. These embodiments may provide synchronicity among devices independent of the relationship of sample clock to a reference clock signal. In some embodiments, devices may also include circuitry that compensates for differing pipeline delays in the data paths of different devices, allowing their data to line up at their front panels.

The counter 30 used in this embodiment is clocked by the sample clock signal (e.g., generated by a clock generation circuit like the one shown in FIG. 4). The counter may be configured to generate a trigger clock signal, TClk, with a frequency equal to 1/N of the sample clock frequency. The counter may be configured to increment each time the sample clock signal transitions from low to high. Upon incrementing a specified number of times (e.g., a midpoint value), the counter 30 may assert the TClk output. After the TClk output is asserted, the counter may continue incrementing until it reaches a full or rollover value. Having reached the full or rollover value, the counter may return to an initial value (typically zero) upon the next sample clock edge. The Clk signal may be deasserted in response to either reaching the full or rollover value or upon resetting to the initial value. Note that more than one counter value (or more than one counter) may be used (e.g., one counter or counter value may control when TClk is asserted and another counter or counter value may control when TClk is deasserted). Each counter value may be programmed independently (or each counter may be programmed with a difference rollover value), allowing the duty cycle of TClk to have values other than 50%. The duty cycle of TClk may be programmably adjusted by programming different values for one or both of the counter values (or for one or more of the counters' rollover values). In some embodiments, the different values of counter 30 may be programmed so that TClk's frequency is close to the frequency of the reference signal or a divided sample clock, whichever is less. However, other embodiments may not select such rollover values.

A counter 30 may include a reset input and an adjustment input. The reset input may be used to reset the counter to an initial value (e.g., 0) and the adjustment input may be used to adjust the current, midpoint, and/or the rollover value of the counter (e.g., to adjust the phase and/or frequency of the signal output by the counter). The counter 30 may toggle the TClk signal at the midpoint value and at the rollover (or initial) value.

The TClk signal itself may be used as a trigger enable signal for receiving and/or sending triggers in some embodiments. In other embodiments, the signal generated by the counter 30 may be output to the enable generator 32. The enable generator 32 may be configured to generate two enable signals, ReceiveTriggerEnable and DriveTriggerEnable, from TClk. Note that in alternative embodiments, counter(s) 30 may be used to generate ReceiveTriggerEnable and DriveTriggerEnable directly from sample clock (instead of generating an intermediate TClk signal).

Circuitry 104 that drives triggers may do so using a flip-flop clocked by sample clock and enabled by DriveTriggerEnable, a signal that asserts for one sample clock period in response to a falling edge on TClk (or in response to a certain number of rising or falling edges in the sample clock signal). Similarly, circuitry 104 that receives triggers may do so using a flip-flop clocked by sample clock and enabled by ReceiveTriggerEnable, a signal that asserts for one sample clock period in response to a rising edge on TClk (or in response to a certain number of rising or falling edges in the sample clock signal).

Figure 6:
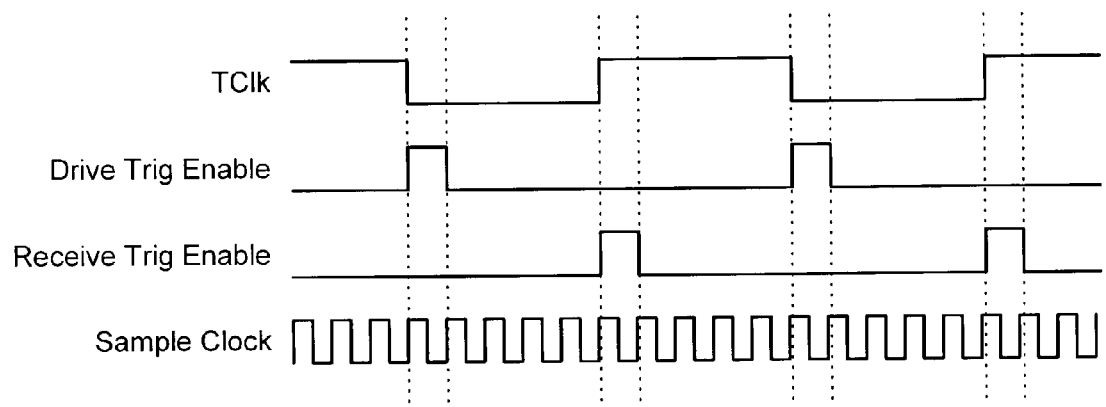
FIG. 6 is a timing diagram illustrating how trigger enable signals may be generated from a TClk signal in one embodiment.

FIG. 6 shows how DriveTriggerEnable and ReceiveTriggerEnable may be generated relative to TClk and the sample clock in one embodiment. In FIG. 6, DriveTriggerEnable is generated for one sample clock period in response to each falling TClk edge. ReceiveTriggerEnable is generated for one sample clock period in response to each rising TClk edge. As mentioned above, note that in some embodiments, DriveTriggerEnable and ReceiveTriggerEnable may be generated directly from the sample clock (e.g., using one or more counters) instead of being generated from an intermediate TClk signal.

Each device's counter 30 may be initially configured with the same full or rollover value. If each device's sample clock is in phase with each other device's sample clock, the counters 30 on each device may generate TClk signals that are in phase.

When the devices 100 to be synchronized begin operating, a reset signal may be provided to the counter 30 included on each device in order to reset each of the trigger enable signal generators 102. However, at certain sample clock frequencies (e.g., above 50 MHz), it may be difficult to provide a reset signal that will be received in the same sample clock cycle by all of the devices. As a result, in some embodiments, the trigger enable signal generators 102 may be reset asynchronously. In embodiments that include a counter 30, this may cause the TClk signals generated on each device to be out of phase with each other. However, the differences between the counters 30 on each device may be calibrated out after the counters have been reset. Once the differences between the counters have been calibrated out, the TClk signals on the devices are substantially in phase.

TClk Calibration

In order to align the counters 30 one each device, the TClk signals on various devices may be compared to each other. Differences between TClk signals generated on different devices may be removed by calibration.

Different embodiments may measure and calibrate the TClk signals generated on each of the devices in different ways. In some embodiments, each device 100 may drive its internal TClk signal onto a connector that is accessible by an operator. For example, each device may drive its TClk signal onto a coaxial connector included on its front panel. An operator may connect each device's output to a device that can measure the phase difference between any two or more of the devices. This measurement device may be an external oscilloscope, a PXI digitizer (e.g., located in the same chassis as the devices 100 whose TClk signals are being measured), or any other device or combination of devices that can perform such a measurement. Once the phase differences between the various TClk signals have been measured, the phase of each TClk signal may be adjusted (e.g., by providing appropriate adjustment inputs to one or more of the counters 30 included on one or more of the devices). Note that in alternative embodiments, each device may drive an output waveform onto a connector in response to that device's TClk signal. The differences in several devices' output waveforms (e.g., the differences in the phase of a periodic output by each of the devices) may be indicative of both the TClk misalignment and sample clock misalignment between those devices.

In some embodiments, this process may be automated. In other embodiments, measuring and adjusting the phase of each TClk signal may involve the performance of one or more manual procedures.

Figure 7:
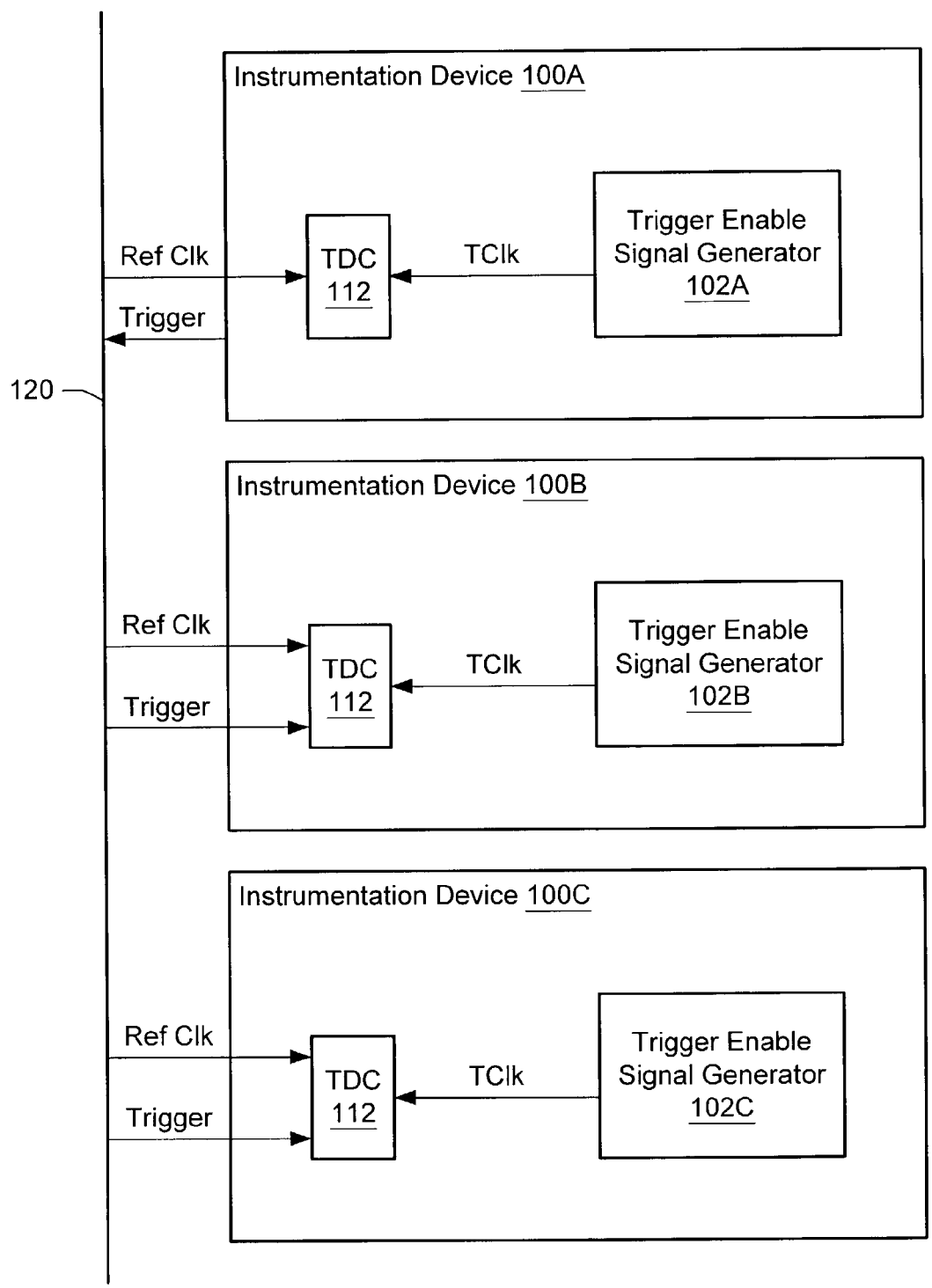
FIG. 7 is a block diagram of another embodiment of an instrumentation system.

In other embodiments, each of the devices to be synchronized may include measurement hardware. FIG. 7 shows one embodiment of an instrumentation system in which each device includes a TDC (Time-to-Digital Converter) 112 that is configured to measure the time between a rising edge of TClk and an edge of the reference clock signal. The edge of the reference clock to use may be indicated by the assertion of a particular trigger signal. In one embodiment, one of the devices (e.g., 100A) being synchronized may be designated as a master device and configured to assert this trigger signal. All devices monitoring this trigger signal may measure the time delay in response to the assertion of this trigger signal. Software (e.g., running on a host computer system 20 as shown in FIGS. 17A-19) may be configured to cause the master device to assert the trigger. Software may also read the delay value measured on each of the devices in response to the trigger. The software may then make the TClk adjustments (e.g., by adjusting a counter value) on each device according to the measurements that are read.

Note that, for the purposes of calibration, the relationship of the reference clock to TClk or to the sample clock may not be relevant. The assertion of the trigger synchronous to the reference clock that initiates the delay measurement may provide a common reference point in time that each of the devices uses to make a measurement.

Figure 8:
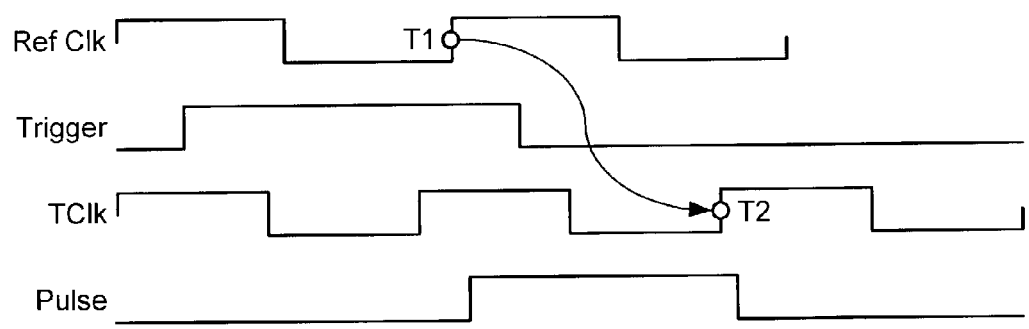
FIGS. 8 and 8A are timing diagrams illustrating how a measurement may be made in order to calibrate TClk signals in different instrumentation devices in some embodiments.

FIG. 8 is a timing diagram illustrating how a TDC 112 may make a calibration measurement in one embodiment. The trigger signal determines the reference clock edge where the measurement starts. Accordingly, when a trigger signal is detected, the TDC 112 may begin measuring at the next edge of the reference clock. In the illustrated embodiment, the measurement begins at the next rising edge, indicated as T1. The TDC 112 may begin the measurement by asserting a pulse signal. The TDC 112 ceases measuring at the next rising edge of TClk, indicated as T2, causing the pulse signal to be deasserted. The TDC 112 measures the assertion time of the pulse signal. Software may read the assertion time from the TDC 112 on each device that is to be synchronized. The difference in the assertion time values read from two devices indicates the difference in phase between those devices' TClks. Accordingly, the differences between different devices' measured assertion times may be used to calibrate the counters on each device.

Figure 8A:
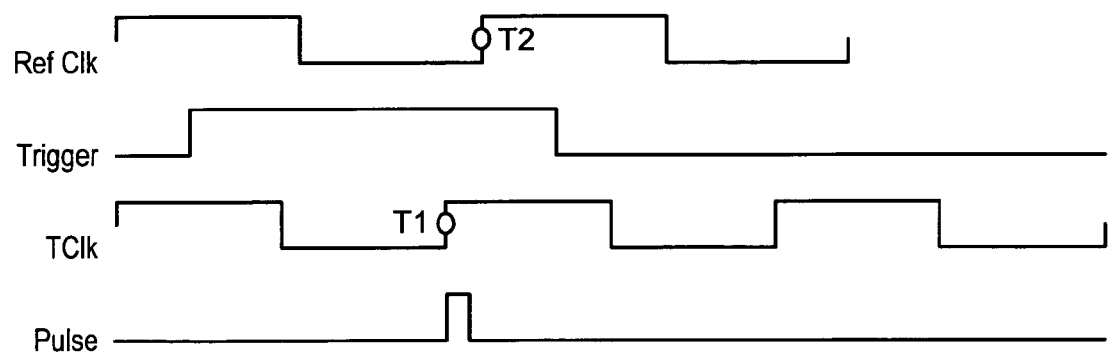

In some embodiments, the width of the pulse generated by the TDC 112 may depend on the frequency of TClk. If the frequency of TClk is not limited to a narrow range, it may be difficult to implement a TDC 112 that can accurately generate and/or measure the broad range of potential pulse widths. However, if the TDC 112 is configured to generate the pulse signal starting with a TClk edge and ending with a reference signal edge, the possible widths of the pulse may have a more manageable range that is independent of the frequency of TClk. Accordingly, in some embodiments, the measurement process shown in FIG. 8 may be modified as shown in FIG. 8A so that the pulse is asserted beginning with the next rising edge of TClk after the assertion of the measurement trigger and ending with the next rising edge of the reference signal.

A third calibration technique may be used in some embodiments where the sample clocks of each device 100 are integer multiples of a reference clock. In these embodiments, the TClk frequency may be set to equal the reference clock frequency. Digital circuitry that is configured to automatically lock the phase of TClk to that of the reference clock may be included on each device 100. This digital circuitry locks each device's TClk to the reference clock, allowing the TClks on each device 100 to be in phase with each other. It also allows devices 100 that use TClk to communicate with devices that use the reference clock as their trigger reference clock.

A fourth calibration technique may be used in some embodiments. In these embodiments, each device 100 within a chassis may be configured to drive its internal TClk onto a connector (e.g., a coaxial connector on its front panel). Each device 100 may also receive a TClk signal from another device 100 through another connector (e.g., the devices may be connected in a daisy-chain fashion). Each device 100 may measure the phase difference, if any, between its own TClk signal and the TClk signal of the other device 100, taking into account any relevant cable delays, and adjust the phase of its own TClk signal to match the phase of the incoming TClk signal.

If the cable delays between devices are known (or detectable by each device), the TClk interconnections may be extended to PCI devices and/or multiple chassis using the same technique used within a single chassis.

Figure 9:
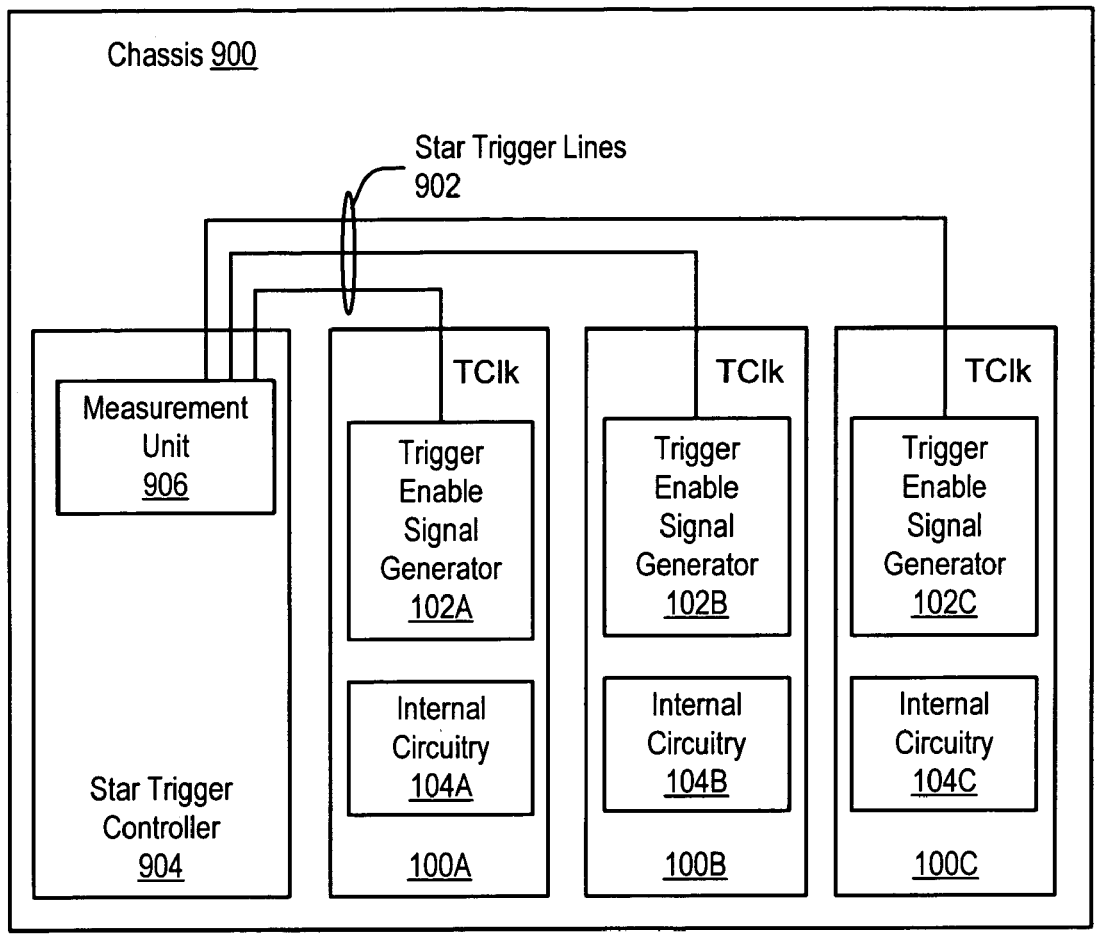
FIG. 9 is a block diagram of an instrumentation system chassis.
Figure 10:
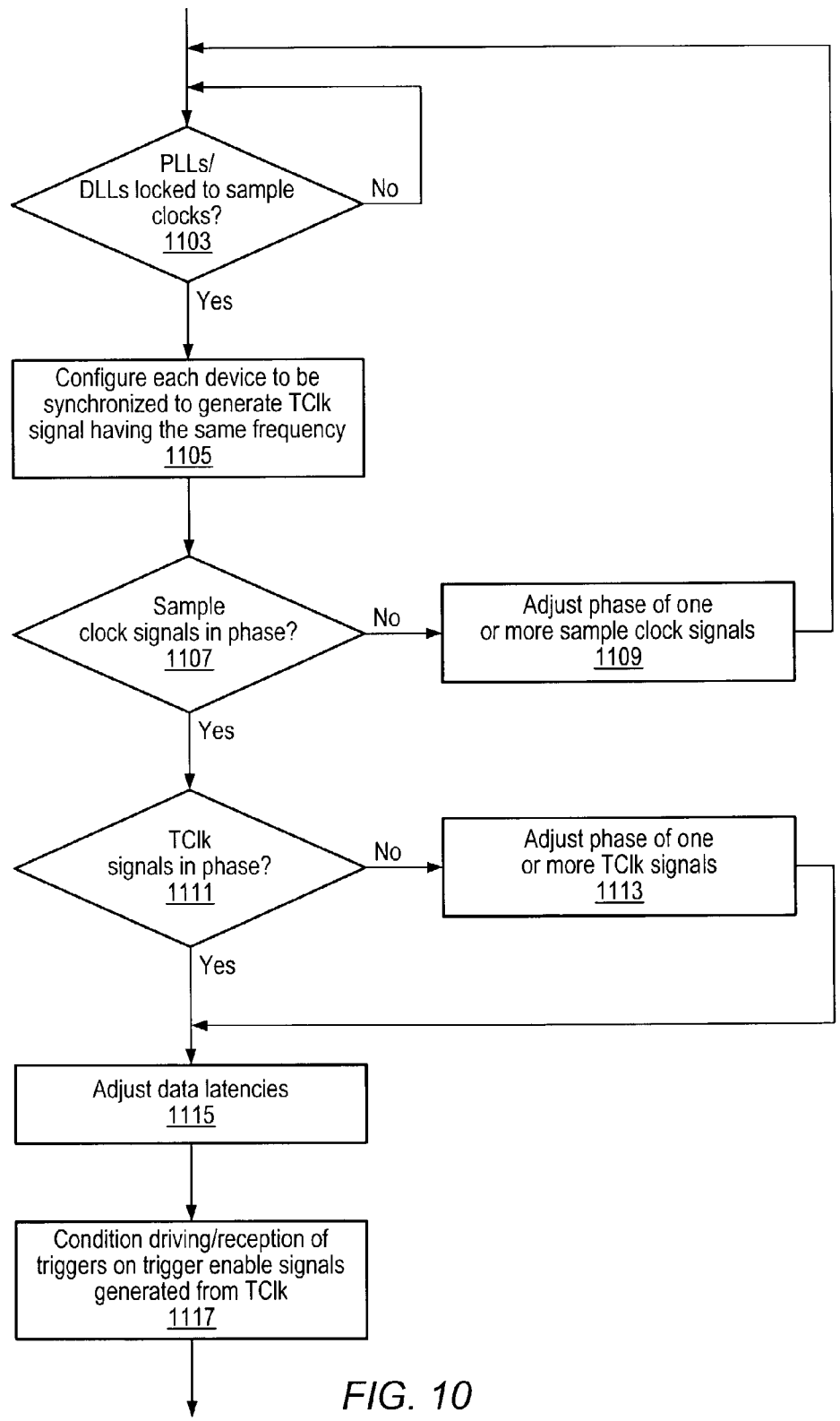
FIG. 10 is a flowchart illustrating one embodiment of a method of synchronizing instrumentation devices.

Yet another calibration technique may be used in embodiments such as the one shown in FIG. 9. FIG. 9 illustrates an instrumentation chassis 900 that includes a star trigger controller 904 and star trigger lines 902 with matched propagation delays that couple the star trigger controller 904 to the other instrumentation devices 100. Each star trigger line 904 is a point-to-point line that can be used to convey star triggers between the star trigger controller 904 and a device 100. In such embodiments, each device 100 may drive its TClk signal onto its star trigger line 902. The star trigger controller 904 may include a measurement unit 906 that measures the time difference between edges (e.g., rising edges) on two or more of its star trigger inputs. Because sample clock signals are assumed to be in phase on all devices, the difference between any two inputs at the star trigger controller 904 will be in integer multiples of the period of the sample clocks. If a difference is detected, software may be used to adjust each device's counter as needed.

Each star trigger controller 904 may also synchronize the TClk signals received on star trigger lines 902 with a signal received via a coaxial input, allowing components within multiple chassis to be synchronized. Similarly, the star trigger controller 904 and send its TClk signal out a coaxial output for use by another chassis. The chassis may be daisy-chained together and each star trigger controller may measure the time difference between an edge in a coaxial input signal (received from a star trigger controller in another chassis) and an edge in a local TClk reference signal. This measurement may take into account the propagation delay from the other chassis to the star trigger controller. Other non-coaxial connectors may be used to link multiple chassis in other embodiments.

Note that similar compensation techniques may be applied in embodiments using other types of trigger lines instead of and/or in addition to star trigger lines, such as bussed trigger lines, front panel trigger lines, and local bus trigger lines.

Delay Path Compensation

The use of synchronization techniques that include local trigger enable signals may provide a means by which two or more instrumentation devices with synchronized sample clocks may have their internal state machines see trigger assertions on the same sample clock edge. If dissimilarities exist in the data path between output units included in the instrumentation devices being synchronized, such as when two analog output devices include DACs that have different delays, additional synchronization techniques may be implemented.

In some embodiments, output units may provide a programmable delay of a certain number of sample clocks in their data path so that a instrumentation devices that include output units with both short and long data paths can be synchronized. The maximum programmable delay of an output unit (e.g., a DAC) may be selected based on the amount of circuitry used to implement that delay. For example, in one embodiment, a maximum delay of 64 clocks may be implemented. While other embodiments may support more than 64 clocks (depending on interpolation levels, for example), it may not be as practical to provide for more delay because of the amount of circuitry required.

Synchronization Method

FIG. 16 shows one embodiment of a method of synchronizing several instrumentation devices. Several of the method's functional blocks may be performed in software in some embodiments.

In one embodiment, software may designate one of the instrumentation devices to be synchronized as the master device and instruct the master device to drive a signal that will be used to synchronize the other devices. For example, the master device may drive a PXI trigger line with a signal that is synchronous to a 10 MHz reference clock. The devices to be synchronized (including the master) may receive the signal on the PXI trigger line and route the signal to the appropriate reset input (e.g., a reset input of a counter 30) of the appropriate synchronization circuitry.

In some embodiments, any PLL and DLL circuits that lock to the sample clock signal may be locked before proceeding, as shown at 1103. In one embodiment, each device may provide register bits indicating the locked/unlocked status of its PLLs and DLLs. The technique for determining PLL or DLL locked status may be device specific in some embodiments.

At 1105, the devices may be configured for the desired frequency of TClk (e.g., by setting counter full or rollover values and/or selecting a signal from which TClk will be generated). Each group of devices to be synchronized may be configured with a common TClk frequency. In one embodiment, the TClk frequency may be selected to be the greatest common factor of the devices' sample clock frequencies. The TClk frequency may also be selected to be less than or equal to 10 MHz. For example, if two devices that have respective sample clocks of 45 MHz and 60 MHz are to be synchronized, their TClk frequencies may be 5 MHz, even though 15 MHz is also a common factor.

If the sample clock signals are not in phase, the sample clocks may be aligned to each other, as indicated at 1107-1109. A determination as to whether the sample clocks signals are in phase may be made by measuring a phase difference in TClk signals generated by each of the devices to be synchronized. In one embodiment, this phase difference may be measured by providing a trigger to each of the devices to be synchronized. In response to the trigger, each device may generate a pulse whose duration is indicative of a delay between an edge of a reference signal and an edge of the TClk signal. This pulse may be input to a TDC circuit configured to output a value indicative of the duration of the pulse. The measured pulse duration may represent an integer number of sample clocks periods and/or a fractional portion of a sample clock period. In one embodiment, the integer number represents the amount that one of the device's TClk signals should be adjusted while the fractional portion indicates the amount the phase of one of the device's sample clock signals needs to be adjusted. For example, if the sample clock period is 10 ns and a TClk misalignment of 102 ns is measured, the 10 sample clock period (100 ns) difference may indicate the TClk adjustment and the 2 ns difference (⅕ of a sample clock period) may indicate the amount of phase adjustment to use for one of the device's sample clock signals.

If one or more of the devices' sample clock signals are adjusted at 1109, the alignment procedure may wait for any PLLs and/or DLLs to lock to the sample clock signals on each device before proceeding, as shown at 1103.

If the TClk signals generated by the devices are not in phase, the TClk signals may be aligned to each other, as shown at 1111 and 1113. In one embodiment, the TClk signals may be aligned by providing a trigger to each of the devices. In response to the trigger, each device may generate a pulse whose duration is indicative of a delay between an edge of a reference signal and an edge of the TClk signal, as done above to adjust for sample clock differences. This pulse may be input to a TDC circuit configured to output a value indicative of the duration of the pulse. The trigger may be asserted by one of the devices that is to be synchronized. The trigger may also be asserted synchronously to the reference clock. Based on the value generated by each device's TDC, the phase of each device's TClk signal may be adjusted (e.g., as described above with respect to the sample clock alignment). This process may be repeated until the TClks are in phase with each other (not shown).

Once the TClks are aligned, one or more of functional blocks 1103-1113 may be repeated if the sample clock used by the devices is provided from a PLLClk/n divider or a DDS chip.

In some embodiments, some devices may have different data latencies than other devices. As shown at 1115, the data latencies of certain devices may be adjusted so that the devices' outputs line up. In one embodiment, each device may have a programmable data latency. The data latencies of devices with shorter data pipelines may be increased until their output lines up with that of the devices that have longer data pipelines.

At 1117, the TClk signal (or one or more trigger enable signals derived from TClk) generated by each device may be used to send and receive triggers. By sending and receiving triggers dependent on edges of the TClk signal, each of the devices may send and receive triggers deterministically. In one embodiment, triggers may be driven in response to a falling edge of TClk and received in response to a rising edge. If desired, additional synchronization functions may also be performed using the TClk signal. For example, a set of oscilloscope devices may each include a decimation counter that should be in phase on each device. A TClk-synchronous trigger may be used to reset the decimation counter in the same sample clock cycle on every device.

Note that in some embodiments, the sample clock signals used by each of the devices to be synchronized may be aligned using a different technique than described above. In some embodiments, each device may include means to adjust the phase of sample clock (e.g., according to a measurement made at the front panel). In other embodiments, sample clock alignment may be achieved in various ways that are dependent on the source of the sample clock. For example, if each device's sample clock signal is generated to have a frequency that is an integer multiple of a 10 MHz reference signal using a PLL, the sample clock signals on each device may be in phase, regardless of whether the devices' PLLs are reset in the same reference signal cycle. If the sample clock frequency is not an integer multiple of the reference signal's frequency, the devices' PLLs may be reset in the same reference signal cycle, synchronous to the reference signal.

Alternatively, if each device's sample clock signal is provided from an external source, the user may ensure that the devices each receive sample clock signals that are aligned with each other. If the devices' sample clock signals are generated by DDS circuitry on each device, the DDS circuitry may be reset synchronously to its reference clock input. For example, if the reference clock is a 10 MHz reference clock, then guaranteeing phase alignment of sample clocks may involve routing a trigger synchronous to 10 MHz reference clock to the reset input of the DDS circuitry. Alternatively, instead of resetting the DDS devices, parameters for one or more of the devices' DDS circuitry may be calibrated based on differences in the sample clock signals measured for two or more of the devices.

Note that in some embodiments, if the reference clock is not the 10 MHz reference clock or if the sample clock is generated by a frequency divider from a PLL output (e.g., the sample clock equals PLLClk/n), the sample clock may initially be generated as the undivided output PLLClk of the PLL. Once the PLLClk and TClk signals on each device are aligned, software may then set the desired value of n and send a TClk synchronous trigger to each device. Each device may use that trigger to reset its frequency divider in the same cycle of PLLClk. Software may then reconfigure the device to use PLLClk/n as the sample clock. The instrumentation system may then align the PLLClk/n signals to each other. Additionally, the TClk signals may be realigned.

Types of Synchronization

Various embodiments of instrumentation systems in which instrumentation devices use an internally generated TClk signal to receive and send triggers may implement different types of synchronization. For example, in some embodiments, a system may be synchronized such that it is a homogeneous system. As described herein, a homogeneous system is a system in which there are no cycle-to-cycle differences between synchronized devices in the system. Thus, sample clocks are all synchronized to each other and all devices' internal circuitry responds to trigger inputs in exactly the same sample clock cycle.

In other embodiments, multiple instrumentation devices may be configured to provide digital stimulus in concert. For example, if each instrumentation device has a 32-bit connector, grouping four of them together may create a 128-bit-digital generation engine. In systems like this, it may be desirable to digitally synchronize the devices that are providing stimulus in concert. In some embodiments, additional pin-to-pin deskewing may be performed for one or more of the instrumentation devices being synchronized in order to implement substantially the same the delay in the devices' input and/or output paths.

Heterogeneous systems with common sample clock circuits may also be implemented using embodiments such as those described above. Although the devices in such a system may not be the same (e.g., they may include a combination of digital and analog waveform generators), if each device contains the same sample clock generation circuit and is programmed to create the same sample clock frequency, then the degree of synchronization achieved in this system may be the same as that achieved in a homogeneous system, subject to the different delays inherent in different designs, such as the delay through a DAC. In some embodiments, one or more delays (e.g., in an input and/or an output path included in a particular device) may be adjusted in order to achieve digital synchronization.

Synchronization in a heterogeneous system means that the assertion of a trigger causes the different devices in the system to consistently respond within a minimum amount of time, preferably one clock period. If there are different sample clock frequencies involved, a consistent system-wide trigger response is possible if a common TClk frequency can be found. If no common TClk frequency can be found for the entire system, then it may not be possible to achieve a consistent system-wide trigger response. It is still possible, however, to logically group devices together that can have a common TClk frequency. Each device within a group may respond consistently to a trigger; however, as a whole, each group may not necessarily respond consistently.

In a stimulus/response-type system, a device such as an Analog Waveform Generator (AWG) may generate a set of stimuli that is provided to a UUT or process under test while other devices measure the response of the UUT to the stimuli. When the AWG switches to the next set of stimuli, it may send a trigger to the devices measuring the response so that they proceed to the next test record. It such a system, a satisfactory degree of synchronization may be achieved if the measuring and stimuli-generating devices operate in lockstep (e.g., even if these devices are not digitally synchronized). For example, if the system contains two devices that generate stimuli, one of them (the master) may be configured to loop continuously and to exit at the end of a loop in which a trigger assertion is detected. The other device may loop continuously as well, but it may be configured to exit its current loop in response to the master asserting a trigger indicating that it has begun the next loop. If the other device does not exit immediately its current loop, it may execute another entire loop of the first record before moving on to the next one.

Note that other types of synchronization may be implemented between devices in other embodiments. For example, in some embodiments, devices may be synchronized such that each device responds to a given trigger signal with a given period (e.g., a window of two or more sample clock cycles).

Figure 11A:
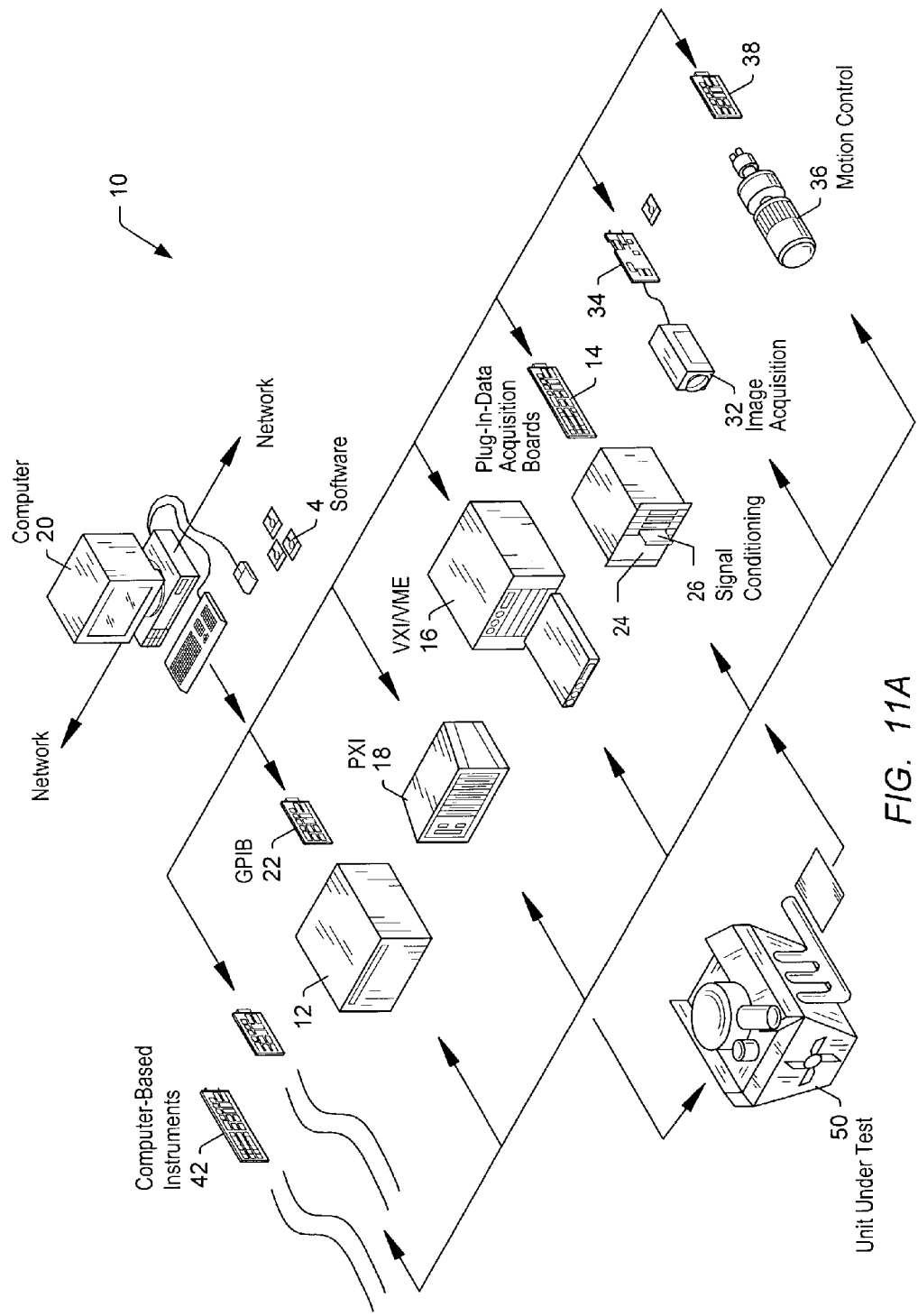
Figure 11B:
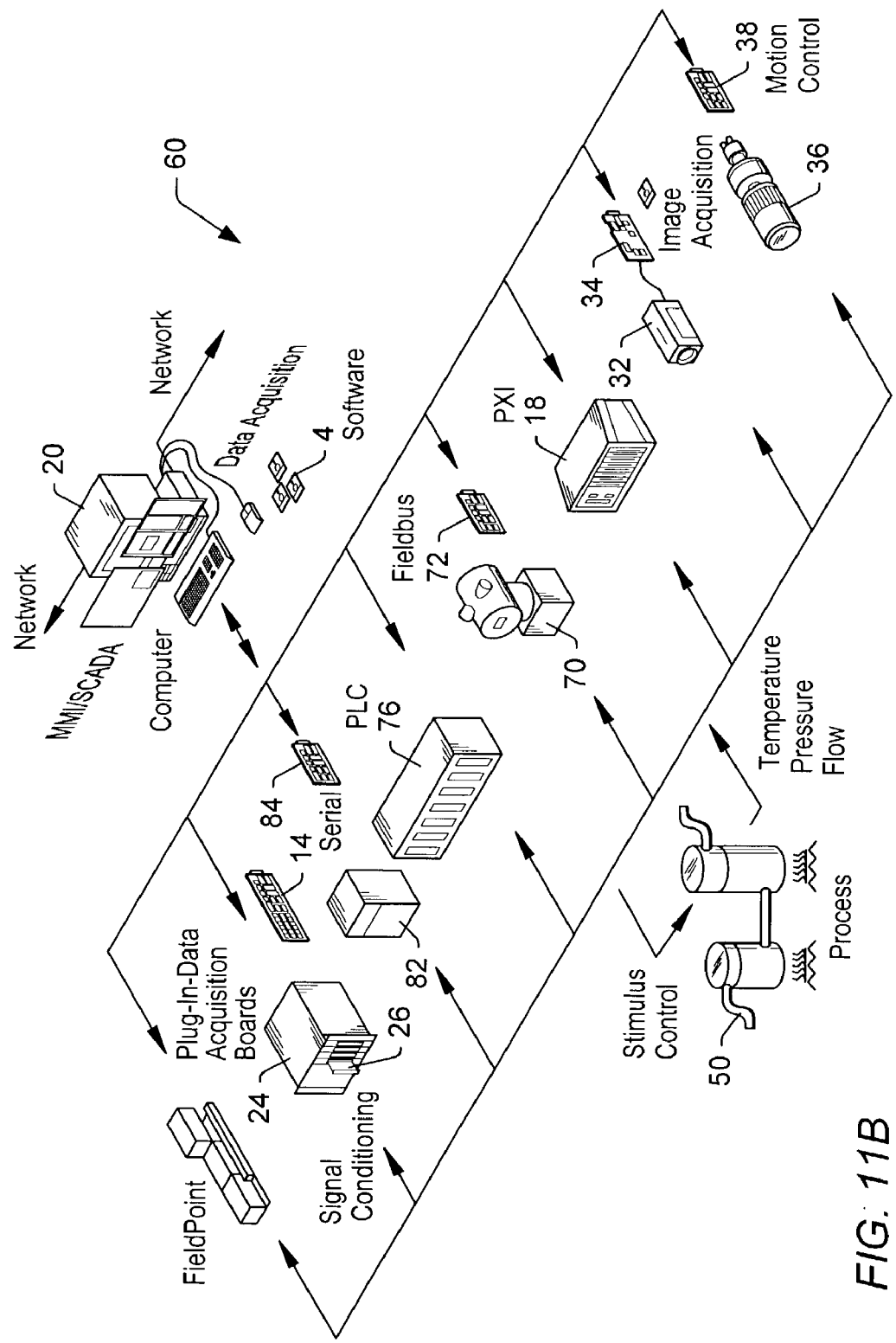

FIGS. 11A and 11B—Instrumentation Systems

FIGS. 11A and 11B illustrate exemplary systems which may include instrumentation devices that are configured to be synchronized using one or more internally generated trigger enable signals as described above. As shown, possible applications of these systems include general data acquisition, including image processing/machine vision, instrumentation, industrial automation, process control, or other purposes.

FIG. 11A illustrates an exemplary instrumentation control system 10. The system 10 may include a host computer 20 that connects to one or more instrumentation devices. The host computer 20 may include a CPU, a display screen, memory, and one or more input devices such as a mouse or keyboard as shown. The computer 20 may connect through the one or more instrumentation devices to analyze, measure, and/or control a unit under test (UUT) 50 or process under test.

The instrumentation devices may include a GPIB (General Purpose Interface Bus) instrument 12 and associated GPIB interface board 22, a data acquisition board 14 and associated signal conditioning circuitry 24, a VXI (VME extensions for Instrumentation) instrument 16, a PXI (PCI extensions for Instrumentation) instrument 18, a video device 32 and associated image acquisition board 34, a motion control device 36 and associated motion control interface board 38, and/or one or more computer based instrument boards 42, among other types of devices. One or more of the instrumentation devices may be configured to delay outputting a trigger signal or performing an operation in response to a received trigger signal until a transition in an internally-generated trigger enable signal as described above.

The GPIB instrument 12 may be coupled to the computer 20 via the GPIB interface board 22 provided by the computer 20. In a similar manner, the video device 32 may be coupled to the computer 20 via the image acquisition board 34, and the motion control device 36 may be coupled to the computer 20 through the motion control interface board 38. The data acquisition board 14 may be coupled to the computer 20, and may interface through signal conditioning circuitry 24 to the UUT 50. The signal conditioning circuitry 24 may comprise an SCXI (Signal Conditioning extensions for Instrumentation) chassis comprising one or more SCXI modules 26.

The GPIB board 22, the image acquisition board 34, the motion control interface board 38, and the DAQ (Data AcQuisition) board 14 may be plugged into an I/O slot in the computer 20, such as a PCI (Peripheral Component Interconnect) bus slot, a PC (Personal Computer) Board slot, or an ISA (Industry Standard Architecture), EISA (Extended ISA), or MicroChannel bus slot provided by the computer 20. However, these boards 22, 34, 38 and 14 are shown external to computer 20 for illustrative purposes.

The VXI chassis or instrument 16 may be coupled to the computer 20 via a VXI bus, MXI bus, or other serial or parallel bus provided by the computer 20. The computer 20 may include VXI interface logic, such as a VXI, MXI, or GPIB interface board (not shown) that interfaces to the VXI chassis 16. The PXI chassis or instrument may be coupled to the computer 20 through the computer's PCI bus.

A serial instrumentation device (not shown) may also be coupled to the computer 20 through a serial port, such as an RS-232 port, USB (Universal Serial Bus) or IEEE 1394 or 1394.2 bus provided by the computer 20. In typical instrumentation control systems, an instrumentation device of each interface type will not be present, and many systems may only have one or more instrumentation devices of a single interface type, such as only GPIB instrumentation devices.

The instrumentation devices may be coupled through one or more sensors or transducers to the UUT 50 or process under test. The system 10 may be used in a data acquisition and control application, in a test and measurement application, a process control application, a man-machine interface application, a hardware-in-the-loop application, or a simulation application, among others.

FIG. 11B illustrates an exemplary industrial automation system 60. The industrial automation system 60 is similar to the instrumentation or test and measurement system 10 shown in FIG. 11A. For convenience, elements which are similar or identical to elements in FIG. 11A have the same reference numerals. The system 60 includes a computer 20 that couples to one or more instrumentation devices. The computer 20 may include a CPU, a display screen, memory, and one or more input devices such as a mouse or keyboard as shown. The computer 20 may connect through the one or more instrumentation devices to a process 50 or device to perform an automation function, such as MMI (Man Machine Interface), SCADA (Supervisory Control and Data Acquisition), portable or distributed data acquisition, process control, advanced analysis, or other control.

The one or more instrumentation devices may include a data acquisition board 14 and associated signal conditioning circuitry 24, a PXI instrument 18, a video device 32 and associated image acquisition board 34, a motion control device 36 and associated motion control interface board 38, a fieldbus device 70 and associated fieldbus interface board 72, a PLC (Programmable Logic Controller) 76, a serial instrumentation device 82 and associated serial interface board 84, or a distributed data acquisition system, such as the Fieldpoint system available from National Instruments, among other types' of instrumentation devices.

The DAQ board 14, the PXI chassis 18, the video device 32, and the image acquisition board 34 may be connected to the computer 20 as described above. The serial instrument 82 may be coupled to the computer 20 through a serial interface board 84, or through a serial port, such as an RS-232 port, provided by the computer 20. The PLC 76 may couple to the computer 20 through a serial port, Ethernet port, or a proprietary interface. The fieldbus interface board 72 may be included in the computer 20 and may interface through a fieldbus network to one or more fieldbus devices. Each of the DAQ board 14, the serial board 84, the fieldbus board 72, the image acquisition board 34, and the motion control board 38 are typically plugged in to an I/O slot in the computer 20 as described above. However, these boards 14, 84, 72, 34, and 38 are shown external to computer 20 for illustrative purposes. In typical industrial automation systems, a device will not be present of each interface type, and many systems may only have one or more devices of a single interface type, such as only PLCs. The devices are coupled to the device or process 50.

Figure 12B:
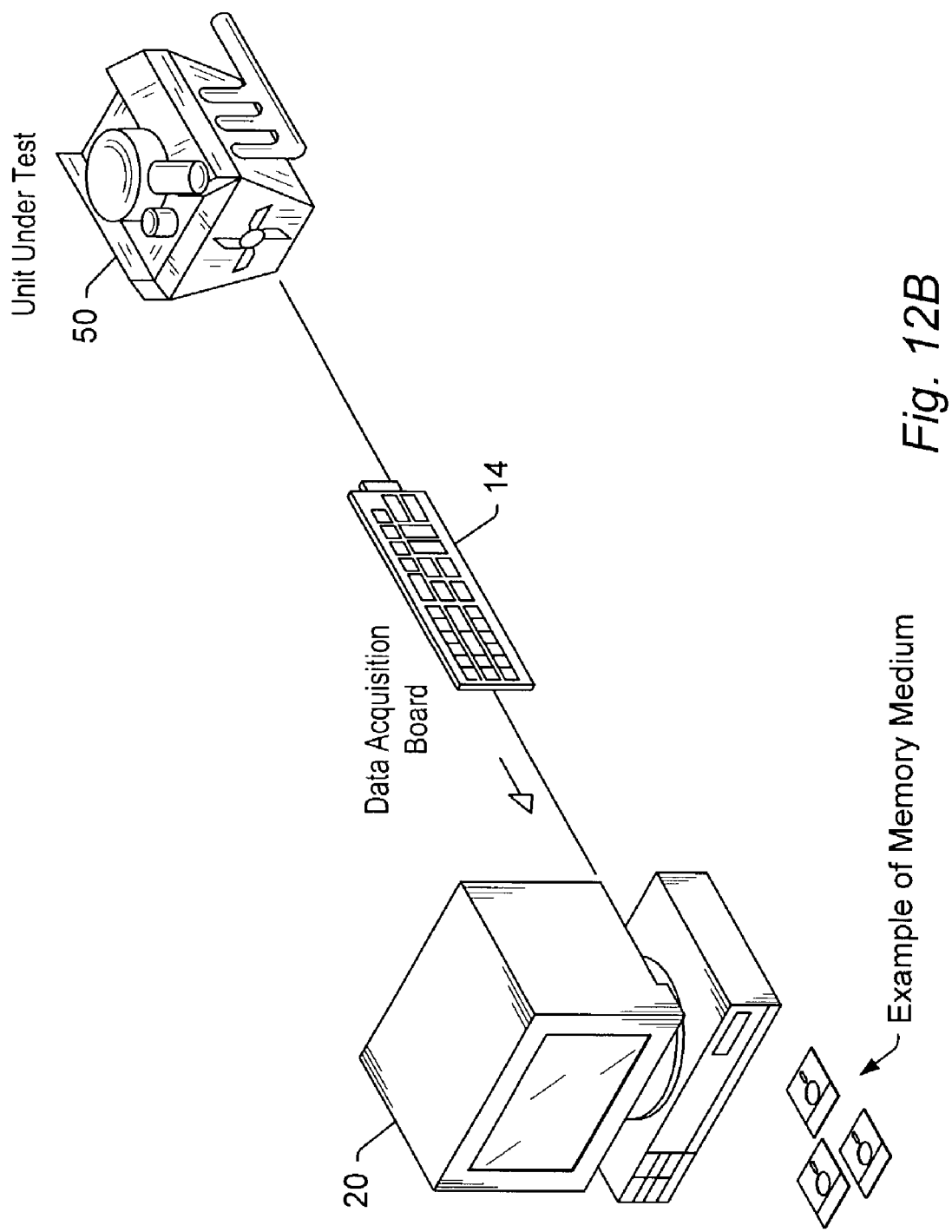

FIGS. 12A and 12B—Data Acquisition and/or Measurement Systems

FIGS. 12A and 12B illustrate exemplary data acquisition and/or measurement systems that may include embodiments of one or more instrumentation devices that send and receive triggers in response to one or more internally generated trigger enable signals. FIG. 12A illustrates a system that includes computer system 20, data acquisition device or board 14, and a signal conditioning system 8. The system may be coupled to measure a unit under test 50. The system may couple to the UUT 50 through a sensor or transducer (not shown). As shown, the signal conditioning system 8 may include a signal conditioning chassis, e.g., an SCXI chassis 24, an SCXI module 26 and one or more SCXI terminal blocks 28.

FIG. 12B illustrates a system that includes computer system 20 and data acquisition device or board 14. In this embodiment, the system does not include a signal conditioning system 8. The data acquisition device or board 14 may couple through a sensor or transducer to a UUT or process under test 50.

Figure 13:
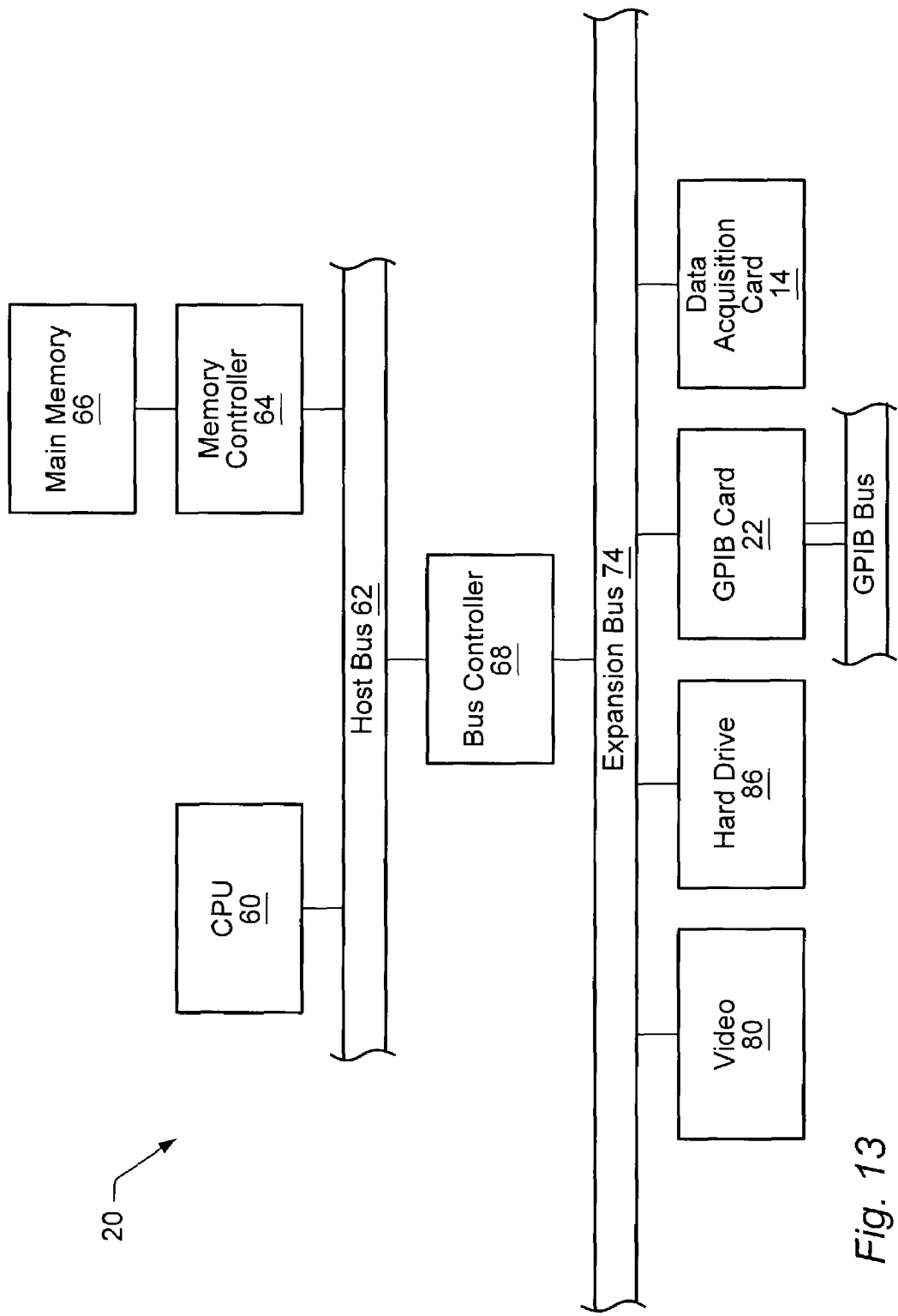
FIG. 13 shows a block diagram of one embodiment of a computer system.

FIG. 13—Computer System

FIG. 13 is a block diagram of an exemplary computer system 20, e.g., the computer system 20 in FIGS. 11A-12B. It is noted that any type of computer system configuration or architecture may be used, and FIG. 13 illustrates a representative PC embodiment. It is also noted that the computer system may be a general purpose computer system as shown in FIGS. 11A-12B, a computer implemented on a VXI board installed in a VXI chassis, a computer implemented on a PXI board installed in a PXI chassis, or other types of embodiments. For simplicity, the elements of a computer not necessary to understand the present invention have been omitted.

The computer 20 includes at least one processor or central processing unit or CPU 60 that is coupled to a processor or host bus 62. The CPU 60 may be any of various types, including an x86 processor, e.g., a Pentium™ class, a PowerPC™ processor, a CPU from the SPARC™ family of RISC processors, as well as others. Main memory 66 is coupled to the host bus 62 by means of memory controller 64.

The main memory 66 may store software according to one embodiment of the present invention for configuring instrumentation devices that send and receive triggers in response to one or more internally generated trigger enable signals. For example, the software may be used to synchronize or calibrate the internally generated trigger enable signals as described above. The main memory 66 also stores operating system software as well as the software for operation of the computer system, as well known to those skilled in the art.

The host bus 62 is coupled to an expansion or input/output bus 74 by means of a bus controller 68 or bus bridge logic. The expansion bus 74 is preferably a PCI expansion bus, although other bus types can be used. The expansion bus 74 may include slots for various devices such as the data acquisition board 14 and/or a GPIB board 22. The computer 20 may further include a video display subsystem 80 and hard drive 86 coupled to the expansion bus 70.

Generally, a computer system 20 may take various forms. As used herein, the term "computer system" is intended to encompass any of various devices that include a processor that can execute instructions from a memory medium and/or may include a programmable logic device that can be configured to execute a method or algorithm. Exemplary computer systems 20 may include a personal computer system, mainframe computer system, workstation, network appliance, Internet appliance, personal digital assistant (PDA), television system, embedded device, intelligent instrument, smart sensor, and other systems.

Numerous variations and modifications will become apparent to those skilled in the art once the above disclosure is fully appreciated. It is intended that the following claims be interpreted to embrace all such variations and modifications.

What is claimed is:

1. An instrumentation system comprising:
    a plurality of instrumentation devices including a first instrumentation device; and
    a communication medium configured to couple the plurality of instrumentation devices;
    wherein the first instrumentation device is configured to process data in response to a sample clock signal and to generate a first trigger enable signal, wherein the first instrumentation device is configured to delay performing an operation in response to a trigger signal transmitted to the first instrumentation device via the communication medium until a transition in the first trigger enable signal;
    wherein the first instrumentation device includes a delay unit configured to measure a delay between a transition in a reference signal and a transition in the first trigger enable signal;
    wherein the first instrumentation device is configured to output data indicative of the delay.

2. The instrumentation system of claim 1, wherein the first instrumentation device is configured to receive data indicative of an amount of compensation, wherein the first instrumentation device is configured to adjust a phase of the first trigger enable signal in response to the data indicative of the amount of compensation.

3. The instrumentation system of claim 2, wherein the first instrumentation device adjusts the phase of the first trigger enable signal by adjusting a current value of a counter.

4. The instrumentation system of claim 3, further including a host computer system configured to receive the data indicative of the delay, to responsively generate the data indicative of an amount of compensation, and to output the data indicative of the amount of compensation.

5. The instrumentation system of claim 1, wherein the first instrumentation device includes an output device, wherein the first instrumentation device is configured to modify a delay of a data path through the output device in response to receiving data indicative of a new delay of the data path through the output device.

\* \* \* \* \*